US008507314B2

(12) United States Patent
Koh et al.

(10) Patent No.: US 8,507,314 B2
(45) Date of Patent: Aug. 13, 2013

(54) ORGANIC LIGHT EMITTING DEVICE AND MANUFACTURING METHOD THEREOF

(75) Inventors: Yuri Koh, Seoul (KR); Moonky Yee, Gyeonggi-do (KR); Woochan Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 357 days.

(21) Appl. No.: 12/881,537

(22) Filed: Sep. 14, 2010

(65) Prior Publication Data

US 2011/0068331 A1    Mar. 24, 2011

(30) Foreign Application Priority Data

Sep. 23, 2009 (KR) .................. 10-2009-0090154
Nov. 23, 2009 (KR) .................. 10-2009-0113154

(51) Int. Cl.
*H01L 51/40* (2006.01)
(52) U.S. Cl.
USPC .................. 438/99; 257/40; 257/E51.001
(58) Field of Classification Search
USPC .................. 257/40, E51.001; 438/99
See application file for complete search history.

(56) References Cited

U.S. PATENT DOCUMENTS

| 2002/0121860 A1 | 9/2002 | Seo et al. |
| 2006/0141135 A1 | 6/2006 | Wang et al. |
| 2008/0111480 A1 | 5/2008 | Lee et al. |

FOREIGN PATENT DOCUMENTS

| CN | 1362747 A | 8/2002 |
| KR | 10-2008-0043180 A | 5/2008 |

OTHER PUBLICATIONS

The First Office Action from The State Intellectual Property Office of the People's Republic of China dated Aug. 1, 2012 in a Chinese counterpart application.
Office Action dated Feb. 27, 2013 from the Korean Intellectual Property Office in counterpart Korean application 10-2009-0090154.
Notification of the Second Office Action dated Feb. 21, 2013 from the State Intellectual Property Office of the People's Republic of China in counterpart Chinese application No. 201010220608.X.

*Primary Examiner* — Anthony Ho
(74) *Attorney, Agent, or Firm* — Morgan, Lewis & Bockius LLP

(57) ABSTRACT

An organic light emitting device comprises a first substrate, a first electrode formed on the first substrate, a hole transporting layer formed on the first electrode, a light emitting layer formed on the hole transporting layer, a second electrode formed on the light emitting layer; and a mixture layer formed between the hole transporting layer and the light emitting layer, where the mixture layer including a hole transporting functioning material, wherein the hole transporting functioning material and the light emitting functioning material have concentration gradient respectively.

10 Claims, 9 Drawing Sheets

ORGANIC LIGHT EMITTING DEVICE AND MANUFACTURING METHOD THEREOF

This application claims the benefit of Korean Patent Application No. 10-2009-0090154 filed on Sep. 23, 2009 and No. 10-2009-0113154 filed on Nov. 23, 2009 which is hereby incorporated by reference.

BACKGROUND

1. Field

The present invention relates to an organic light emitting device (OLED) and a manufacturing method thereof, and more particularly, to an OLED of improving its lifespan and of having a high reliability and a manufacturing method thereof.

2. Related Art

With the development of multimedia, a flat panel display (FPD) is recently gaining its importance. In line with this trend, several flat type displays, such as a liquid crystal display (LCD), a plasma display panel (PDP), a field emitting display (FED), and an organic light emitting device (OLED), are being put to practical use.

In particular, the OLED is a self-emitting type which has a high-speed response speed (i.e., a response speed of 1 ms or less) and low consumption power. The OLED is also advantageous as a motion image display medium irrespective of the size of the device because it has no problem in the viewing angle. Further, an organic light emitting diode display device employing the OLED is being in the spotlight as the next-generation FPD because the OLED can be fabricated at low temperature and has a simple manufacturing process based on the existing semiconductor process technology.

The OLED comprises a first electrode, a second electrode, and a light emitting layer disposed between the first electrode and the second electrode. Holes supplied from the first electrode and electrons supplied from the second electrode bond together in the light emitting layer to form excitons, and the OLED emits light due to energy generated when the excitons returns to the bottom level.

However, materials used for the OLED, the stacked structures the OLED or the like have much influence on its lifespan and efficiency. Therefore, a study on the OLED is being actively progressed in order to develop an OLED having longer lifespan and better efficiency.

SUMMARY

Embodiments of the present invention provide an organic light emitting device of improving its lifespan and having a high reliability and a manufacturing method thereof.

According to an exemplary embodiment of the present invention, there is provided n organic light emitting device (OLED), comprising a first substrate, a first electrode formed on the first substrate, a hole transporting layer formed on the first electrode, a light emitting layer formed on the hole transporting layer, a second electrode formed on the light emitting layer; and a mixture layer formed between the hole transporting layer and the light emitting layer, where the mixture layer including a hole transporting functioning material, wherein the hole transporting functioning material and the light emitting functioning material have concentration gradient respectively.

Also, according to an exemplary embodiment of the present invention, there is provided a manufacturing method of an organic light emitting device comprising, forming a first electrode on a first substrate, forming a heat-generating element on a second substrate facing the first substrate, sequentially forming a light emitting functioning material pattern and a hole transporting functioning material pattern over the second substrate provided with the heat-generating element, aligning and combining the first substrate and the second substrate, and transferring the hole transporting functioning material pattern and the light emitting functioning material pattern, by applying a voltage to the heat-generating element on the second substrate, to thereby simultaneously form a hole transporting layer, a mixture layer where the mixture layer includes the hole transporting functioning material and the light emitting functioning material, wherein the hole transporting functioning material and the light emitting functioning material have a concentration gradient respectively and forming a second electrode over the first substrate.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION

Hereinafter, an implementation of this document will be described in detail with reference to the attached drawings. Reference will now be made in detail embodiments of the invention examples of which are illustrated in the accompanying drawings.

An organic light emitting device (OLED) according to an embodiment of this document, comprises a first substrate, a first electrode formed on the first substrate, a hole transporting layer formed on the first electrode, a light emitting layer formed on the hole transporting layer, a second electrode formed on the light emitting layer; and a mixture layer formed between the hole transporting layer and the light emitting layer, where the mixture layer including a hole transporting functioning material, wherein the hole transporting functioning material and the light emitting functioning material have concentration gradient respectively.

In the mixture layer, the hole transporting layer may have a concentration gradient where a concentration of the hole transporting functioning material decreases toward the light emitting layer.

In the mixture layer, the light emitting layer may have a concentration gradient where a concentration of the light emitting functioning material increases toward the light emitting layer.

In the mixture layer, the hole transporting functioning material and the light emitting functioning material may have concentration gradients inversely proportional to each other.

The light emitting layer may have a thickness of about 5 to 150 nm.

A thickness of the mixture layer may be about 1 to 30% relative to that of the light emitting layer.

The OLED may further comprises a hole injecting layer between the first electrode and the hole transporting layer.

The OLED may further comprises any one or more of an electron transporting layer and an electron injecting layer between the light emitting layer and the second electrode.

A manufacturing method of an organic light emitting device according to an embodiment of this document comprises, forming a first electrode on a first substrate, forming a heat-generating element on a second substrate facing the first substrate, sequentially forming a light emitting functioning material pattern and a hole transporting functioning material pattern over the second substrate provided with the heat-generating element, aligning and combining the first substrate and the second substrate, and transferring the hole transporting functioning material pattern and the light emitting functioning material pattern, by applying a voltage to the heat-generating element on the second substrate, to thereby simultaneously form a hole transporting layer, a mixture layer where the mixture layer includes the hole transporting functioning material and the light emitting functioning material, wherein the hole transporting functioning material and the light emitting functioning material have a concentration gradient respectively and forming a second electrode over the first substrate.

In the mixture layer, the hole transporting layer may have a concentration gradient where a concentration of the hole transporting functioning material decreases toward the light emitting layer.

In the mixture layer, the light emitting layer may have a concentration gradient where a concentration of the light emitting functioning material increases toward the light emitting layer.

In the mixture layer, the hole transporting functioning material and the light emitting functioning material may have concentration gradients inversely proportional to each other.

The light emitting layer may have a thickness of about 5 to 150 nm.

A thickness of the mixture layer may be about 1 to 30% relative to that of the light emitting layer.

The manufacturing method may further comprises forming a hole injecting layer on the first electrode before forming the hole transporting layer, the mixture layer, and the light emitting layer.

The manufacturing method may further comprises sequentially forming an electron transporting layer and an electron injecting layer on the light emitting layer after forming the hole transporting, the mixture layer, and the light emitting layer.

The manufacturing method may further comprises forming an insulating layer on the second substrate before forming the hole transporting functioning material pattern and the light emitting functioning material pattern over the second substrate.

The heat-generating element may be made of at least one selected from the group of consisting of Ag, Au, Al, Cu, Mo, Pt, Ti, W, and Ta.

One or more embodiments of this document will now be described in detail with reference to the accompanying drawings.

Figure 1:
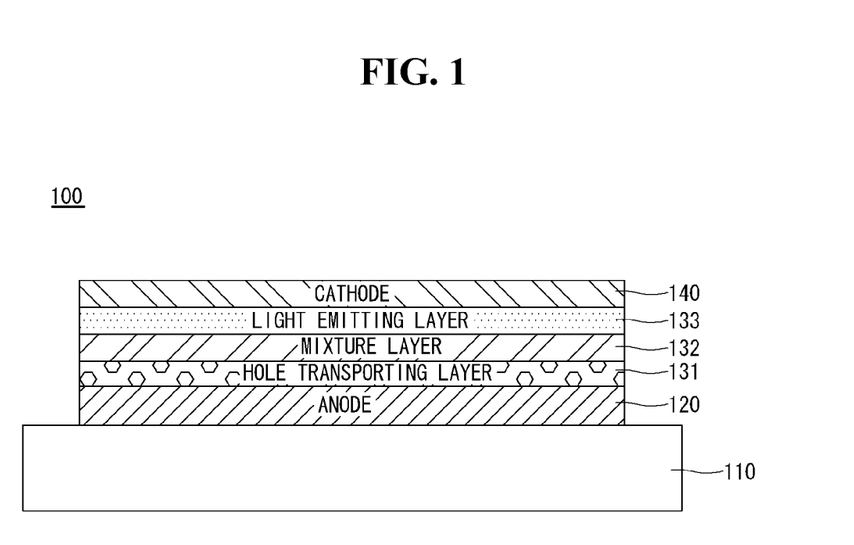
FIG. 1 is a diagram illustrating an OLED according to a first embodiment of this document.

FIG. 1 is a diagram illustrating an OLED according to a first embodiment of this document.

Referring FIG. 1, an OLED 100 according to the first embodiment of this document comprises a substrate 110, a first electrode 120 formed on the substrate 110, a hole transporting layer 131 formed on the first electrode 120, a light emitting layer 133 formed over the hole transporting layer 131, and a second electrode 140 formed on the light emitting layer 133, and further comprises a mixture layer 132, interposed between the hole transporting layer 131 and the light emitting layer 133, of a hole transporting functioning material and a light emitting functioning material which have concentration gradient respectively.

The substrate 110 may be made of glass, plastic, or metal, and may be further provided with thin film transistor formed of semiconductor layer, gate electrode, source electrode, and drain electrode.

The first electrode 120 may be transparent or reflective. If the first electrode 120 is transparent, it may be made of any one of indium tin oxide (ITO), indium zinc oxide (IZO), and zinc oxide (ZnO).

If the first electrode 120 is reflective, it may further comprise a reflection layer, made of any one of aluminum (Al), silver (Ag), and nickel (Ni), placed under a layer made of any one of ITO, IZO and, ZnO, or further may comprise a reflection layer interposed between two layers made of any one of ITO, IZO and ZnO.

The first electrode 120 may be formed using the sputtering, the evaporation, the vapor phase deposition, or the electron beam deposition.

The hole transporting layer 131 functions to make smooth the transport of holes. The hole transporting layer 131 may be made of at least one selected from the group consisting of NPD (N,N-dinaphthyl-N,N'-diphenyl benzidine), TPD (N,N'-bis-(3-methylphenyl)-N,N'-bis-(phenyl)-benzidine), s-TAD and MTDATA (4,4',4"'-Tris(N-3-methylphenyl-N-phenyl-amino)-triphenylamine), but not limited thereto.

The hole transporting layer 131 may be formed using the evaporation or the spin coating, and the hole transporting layer 131 may have a thickness of about 5 to 150 nm.

The light emitting layer 133 may be made of materials emitting pieces of light of red, green, and blue, or of a phosphorescent material or a fluorescent material.

If the light emitting layer 133 is a red light emitting layer, it may be made of a phosphorescent material which comprises a host material comprising CBP (carbazole biphenyl) or mCP(1,3-bis(carbazol-9-yl) and a dopant comprising any one or more selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium), and PtOEP(octaethylporphyrin platinum). Alternatively, it may be made of a fluorescent material comprising PBD:Eu(DBM)$_3$(Phen) or Perylene, but not limited thereto.

If the light emitting layer 133 is a green light emitting layer, it may be made of a phosphorescent material which comprises a host material comprising CBP or mCP and a dopant material comprising Ir(ppy)3(fac tris(2-phenylpyridine)iridium). Alternatively, it may be made of a fluorescent material comprising Alq3(tris(8-hydroxyquinolino)aluminum, but not limited thereto.

If the light emitting layer 133 is a blue light emitting layer, it may be made of a phosphorescent material which comprises a host material comprising CBP or mCP and a dopant material comprising $(4,6-F_2\text{ ppy})_2\text{Irpic}$. Alternatively, it may be made of a fluorescent material comprising at least one selected from the group consisting of spiro-DPVBi, spiro-6P, distyryl benzene (DSB), distyrylarylene (DSA), PFO series polymer, and PPV series polymer, but not limited thereto.

The light emitting layer 133 may be formed using the evaporation or the thermal transfer method, and may have a thickness of about 5 to 150 nm.

The second electrode 140 may be made of metal having a low work function, such as magnesium (Mg), calcium (Ca), aluminum (Al), silver (Ag), or an alloy thereof. Here, in the case where the OLED has a top emission structure or a top and a bottom amission structure, the second electrode 140 may be thin enough to transmit light, and in the case where the OLED has a bottom emission amission structure, it may be thick enough to reflect light.

In the first embodiment of the this document, the mixture layer 132 is provided between the light emitting layer 133 and the hole transporting layer 131.

The mixture layer 132 may be placed between the light emitting layer 133 and the hole transporting layer 131 to function to make smooth the injection of holes from the first electrode 120.

For interfacial characteristics with the hole transporting layer 131, the mixture layer 132 may have a concentration of the hole transporting functioning material which gradually decreases from a region near to the hole transporting layer 131 toward a region near to the light emitting layer 133.

In addition, for interfacial characteristics with the light emitting layer 133, the mixture layer 132 may have a concentration of the light emitting functioning material which gradually increases from a region near to the hole transporting layer 131 toward a region near to the light emitting layer 133.

Figure 2:
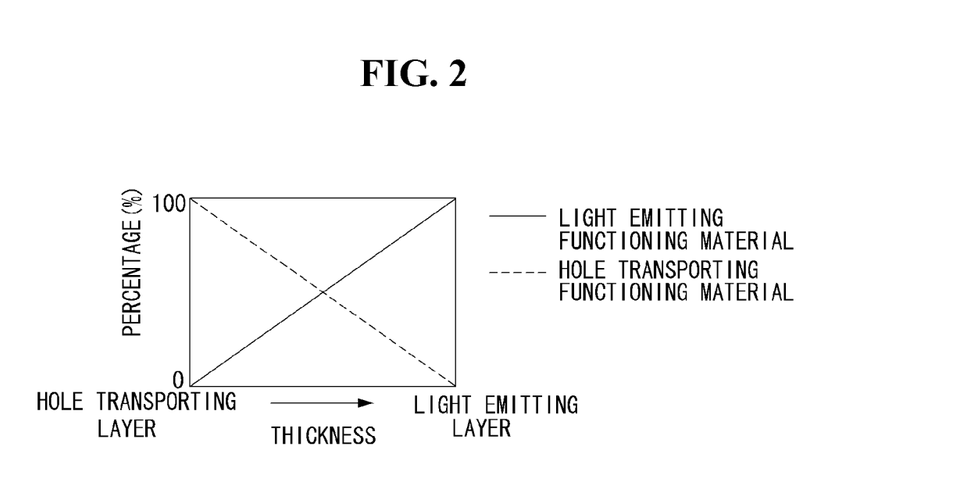
FIG. 2 is a graph illustrating concentration gradients for a hole transporting functioning material and a light emitting functioning material in a mixture layer according to the first embodiment.

FIG. 2 is a graph illustrating concentration gradients for the hole transporting functioning material and the light emitting functioning material in the mixture layer according to an embodiment of this document.

Referring to FIG. 2, in the mixture layer 132, percentage of the hole transporting functioning material gradually decreases toward a region near to the light emitting layer from a region near to the hole transporting layer 131. on the contrary, a percentage of the light emitting functioning material gradually increases in inverse proportion thereto.

The mixture layer 132 may have a thickness of 1 to 30% relative to that of the light emitting layer 133. Here, if the thickness of the mixture layer 132 is 1% or more relative to that of the light emitting layer 133, it is possible to improve efficiency and lifespan of the device by making smooth the injection of holes due to lowering an energy barrier between the hole layer 131 and the light emitting layer 133, and if the thickness of the mixture layer 132 is 30% or less relative to that of the light emitting layer 133, it is possible to prevent increase in its driving voltage and a low efficiency due to the large thickness.

The mixture layer 132 may be formed using the evaporation or the thermal transfer method. If the description is made by exemplifying the evaporation, a hole transporting functioning material and a light emitting functioning material are prepared as targets in the same chamber, and then a hole transporting layer is formed by depositing only the hole transporting functioning material on the first electrode. After forming the hole transporting layer, a deposition ratio of the hole transporting functioning material gradually decreases, and, in this state, the light emitting functioning material begins to be deposited and its deposition ratio gradually increases to form the mixture layer. The deposition ratio of the hole transporting functioning material becomes 0% and the deposition ratio of the light emitting functioning material becomes 100% to form the mixture layer 132.

Figure 3:
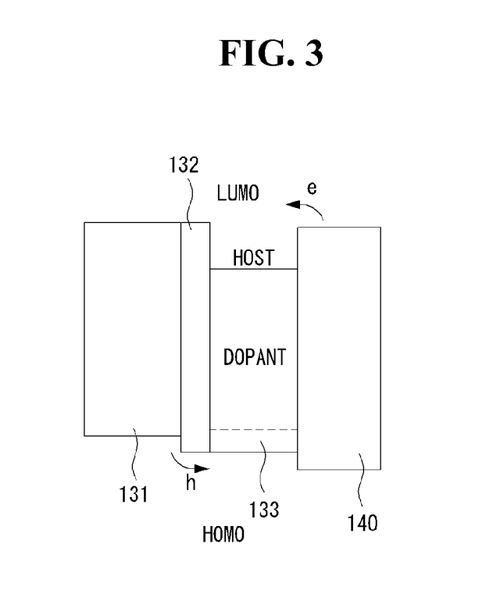
FIG. 3 is a band diagram for the OLED according to an embodiment of this document.

FIG. 3 is a band diagram for the OLED according to an embodiment of this document.

FIG. 3 is a band diagram where the hole transporting layer 131, the mixture layer 132 and the light emitting layer 133 are sequentially stacked.

Holes h from the first electrode are injected to the mixture layer 132 via the hole transporting layer 131, and in turn the holes injected to the mixture layer 132 are injected to the light emitting layer 133. Electrons e from the second electrode 140 are injected to the light emitting layer 133, where the holes h and the electrons e form excitons to emit light.

Here, the mixture layer 132 formed between the hole transporting layer 131 and the light emitting layer 133 makes smooth the injection of the holes h to the light emitting layer 133 by reducing an energy barrier between the hole transporting layer 131 and the light emitting layer 133, and this causes a light emitting region in the light emitting layer 133 to be formed in a central position of the light emitting layer 133.

Therefore, there is an advantage in that efficiency and lifespan of the OLED can be improved by the light emitting region being formed in a central position of the light emitting layer 133.

Figure 4:
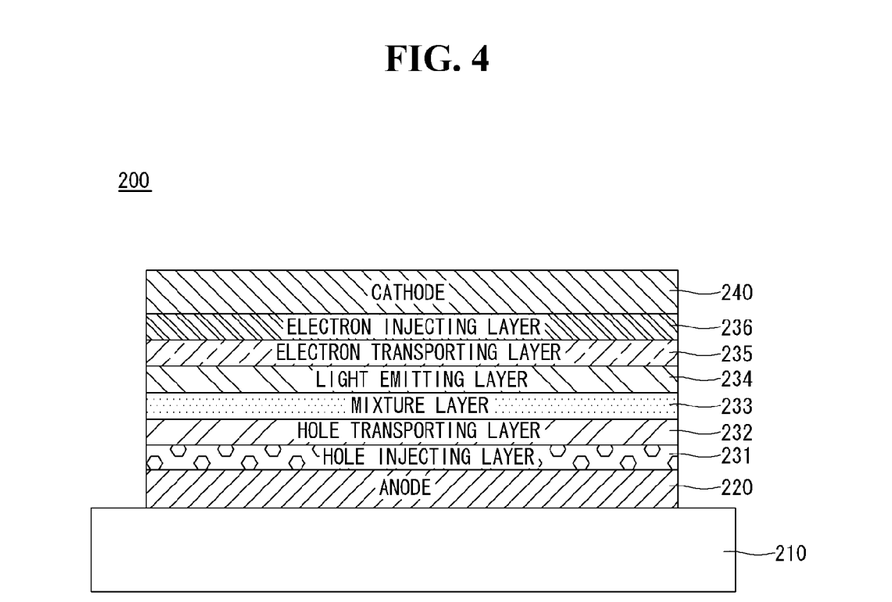
FIG. 4 is a diagram illustrating an OLED according to a second embodiment of this document.

FIG. 4 is a diagram illustrating an OLED according to a second embodiment of this document. The same configuration as the first embodiment will be described in outline.

Referring to FIG. 4, an OLED 200 according to the second embodiment of this document comprises a substrate 210, a first electrode 220 formed on the substrate 210, a hole injecting layer 231 formed on the first electrode 220, a hole transporting layer 232 formed on the hole injecting layer 231, a light emitting layer 234 formed over the hole transporting layer 232, an electron transporting layer 235 formed on the light emitting layer 234, an electron injecting layer 236 formed on the electron transporting layer 235, and a second electrode 240 formed on the electron injecting layer 236, and further comprises a mixture layer 233, interposed between the hole transporting layer 232 and the light emitting layer 234, of a hole transporting functioning material and a light emitting functioning material which have concentration gradient respectively.

The OLED 200 further comprises the hole injecting layer 231 formed between the first electrode 220 and the hole transporting layer 232, and moreover further comprises the electron transporting layer 235 and the electron injecting layer 236 formed between the light emitting layer 234 and the second electrode 240.

The hole injecting layer 231 functions to make smooth the injection of holes from the first electrode 220 to the light emitting layer 234. The hole injecting layer 231 may be made of at least one selected from the group consisting of CuPc (copper phthalocyanine), PEDOT (poly(3,4)-ethylenediox-ythiophene), PANI (polyaniline), and NPD (N,N-dinaphthyl-N,N'-diphenyl benzidine), but not limited thereto.

The hole injecting layer 231 may be formed using the evaporation or the spin coating, and the hole injecting layer 231 may have a thickness of about 1 to 150 nm.

The electron transporting layer 235 functions to make smooth the transport of electrons, and it may be made of at least one selected from the group consisting of Alq3(tris(8- hydroxyquinolino)aluminum), PBD, TAZ, spiro-PBD, BAlq, and SAlq, but not limited thereto.

The electron transporting layer 235 may be formed using the evaporation or the spin coating, and the electron transporting layer 235 may have a thickness of about 1 to 50 nm.

The electron transporting layer 235 may function to prevent the movement of holes from the first electrode 220 to the second electrode 240 via the light emitting layer. In other words, the electron transporting layer 235 functions as a hole blocking layer to enable holes and electrons to efficiently bond together in the light emitting layer 234.

The electron injecting layer 236 functions to make smooth the injection of electrons, and it may be made of at least one selected from the group consisting of Alq3(tris(8-hydroxyquinolino)aluminum), PBD, TAZ, spiro-PBD, BAlq, and SAlq, but not limited thereto.

The electron injecting layer 236 may be further made of inorganic matter, and the inorganic matter may comprise metal compound. The metal compound may comprise alkaline metal or alkaline earth metal. The metal compound comprising the alkaline metal or alkaline earth metal may be at least one selected from the group consisting of LiQ, LiF, NaF, KF, RbF, CsF, FrF, $BeF_2$, $MgF_2$, $CaF_2$, $SrF_2$, $BaF_2$, and $RaF_2$, but not limited thereto.

The electron injecting layer 236 may be formed using the evaporation or the spin coating, and the electron injecting layer 236 may have a thickness of about 1 to 50 nm.

As described above, the OLEDs according to the first and second embodiments of this document has an advantage of improving lifespan of the OLED, by forming the mixture layer where the hole transporting functioning material and the light emitting functioning material have concentration gradient respectively, between the hole transporting layer and the light emitting layer.

Figure 5:
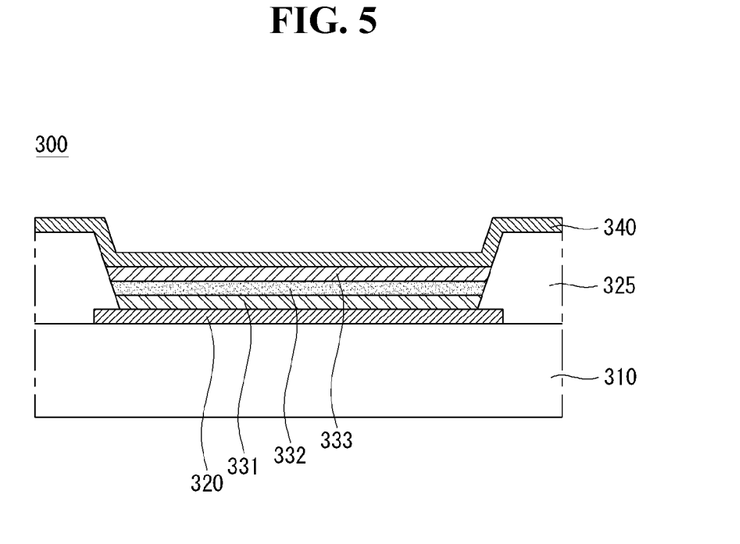
FIG. 5 is a diagram illustrating an OLED according to a third embodiment of this document.

FIG. 5 is a diagram illustrating an OLED according to a third embodiment of this document, and FIGS. 6A to 6F are diagrams illustrating the respective steps in a manufacturing method according to the third embodiment of this document.

Referring to FIG. 5, an OLED 300 according to the third embodiment of this document comprises a first substrate 310, a first electrode 320 formed on the first substrate 310, a bank layer 325 covering the edges of the first electrode 320 and exposing the first electrode 320, a hole transporting layer 331 formed on the first electrode 320, a light emitting layer 333 formed over the hole transporting layer 331, and a second electrode 340 formed on the light emitting layer 333, and further comprises a mixture layer 332, interposed between the hole transporting layer 331 and the light emitting layer 333, of a hole transporting functioning material and a light emitting functioning material which have concentration gradient respectively.

A manufacturing method of the OLED 300 with the configuration described above will be described. Description of the same constituent elements as the first and second embodiments will be omitted.

Figure 6A:
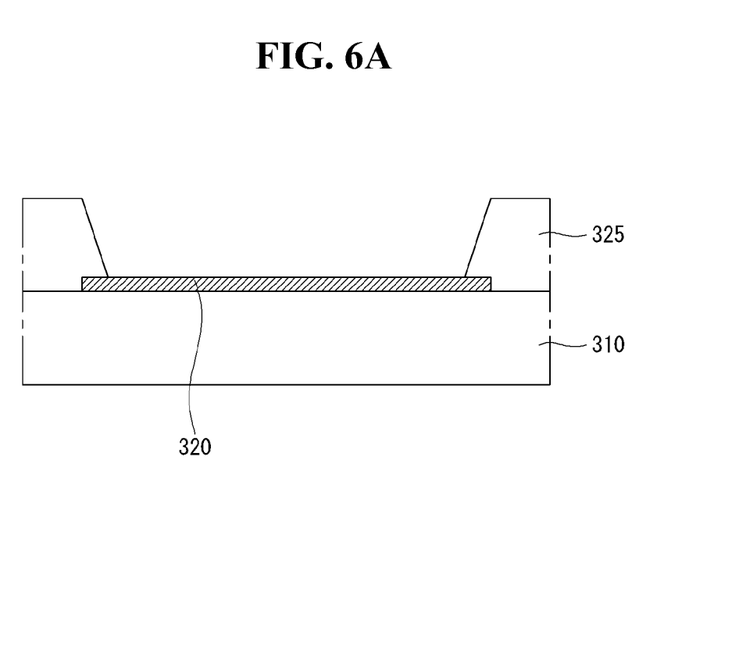
FIGS. 6A to 6F are diagrams illustrating the respective steps in a manufacturing method of the OLED according to the third embodiment of this document.

Referring to FIG. 6A, the first electrode 320 is formed on the first substrate 310. The first substrate 310 may be made of glass, plastic or metal, and may be further provided with thin film transistors formed of semiconductor layers, gate electrodes, source electrodes and drain electrodes.

The bank layer 325 is formed on the first electrode 320. The bank layer 325 covers the edges of the first electrode 320 and exposes the first electrode 320. The bank layer 325 defines each pixel region on the first substrate 310 provided with the first electrode 320.

Figure 6B:
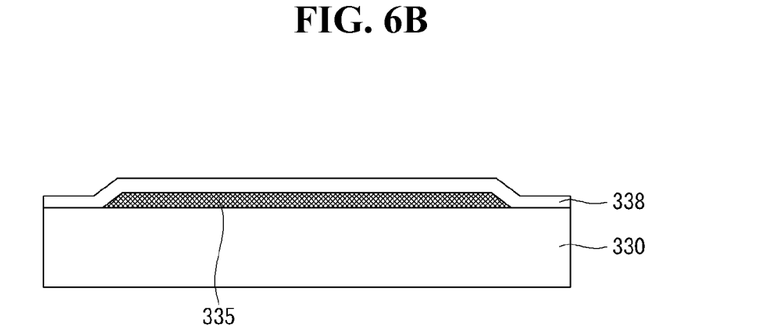

In FIG. 6B, a heat-generating element 335 is formed on a second substrate 330 which is made of transparent glass or plastic. A size of the second substrate 330 may be equal to or greater than that of the first substrate 310.

The heat-generating element 335 may be made of at least one selected from the group consisting of Ag, Au, Al, Cu, Mo, Pt, Ti, W, and Ta, which can generate heat by application of voltage, but not limited thereto.

The heat-generating element may be formed using any method such as the CVD (chemical vapor deposition), the sputtering, the E-beam, electrolysis/electroless plating, or the like. The heat-generating element 235 is formed by depositing the metal or the alloy thereof on an entire surface and by patterning the metal or the alloy thereof deposited on the entire surface through a photolithography process and a wet etching or a dry etching.

The heat-generating element 335 is formed in accordance with a pixel position on the first substrate 310 in which an organic light emitting functioning material will be transferred. A width of the heat-generating element 335 formed on the second substrate 330 may be equal to or less than a value obtained by summing a width of each pixel on the first substrate 310, and a width of the bank layer 325 which partitions adjacent pixels. A thickness of the heat-generating element 335 may be maximally 1 μm in consideration of a resistance component which generates joule heat.

In order to prevent the heat-generating element 335 generating joule heat from being oxidized or diffused to the light emitting functioning material, an insulating layer 338 may be further formed on the heat-generating element 335. The insulating layer 338 may be formed of a silicon oxide layer, a silicon nitride layer, or a silicon oxinitride layer, and deposited on the entire surface of the heat-generating element 335. The following description is made by exemplifying the second substrate 330 where the insulating layer 338 is not formed.

Figure 6C:
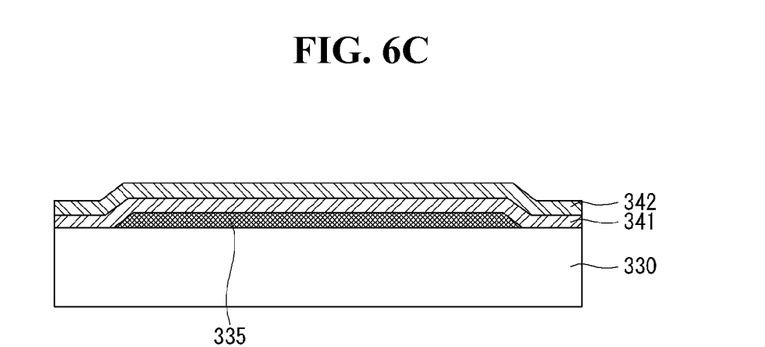

Referring to FIG. 6C, a hole transporting functioning material and an organic light emitting functioning material are deposited, by the thermal evaporation or the like, on the entire surface of the second substrate where the heat-generating element 335 is formed, and thereafter a light emitting functioning material pattern 341 and a hole transporting functioning material pattern 342 are sequentially formed on the heat-generating element 335 corresponding to a position where each pixel will be formed on the first substrate 310.

At this time, the hole transporting functioning material pattern 342 may be made of the same material as the above-described hole transporting layer, and the light emitting functioning material pattern 341 may be made of light emitting functioning materials of light of red, green, and blue, or of a phosphorescent material or a fluorescent material.

Figure 6D:
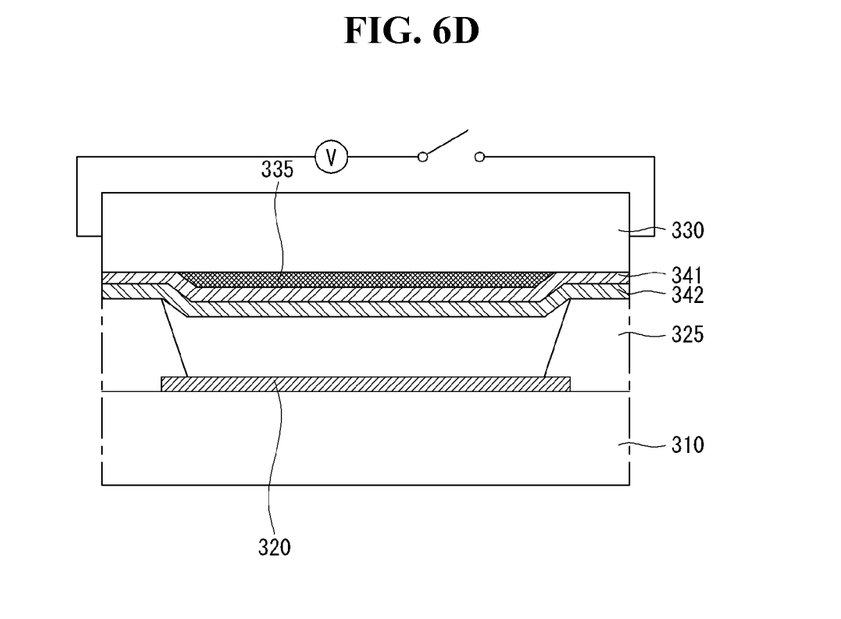

Referring to FIG. 6D, the first substrate 310 with the first electrode 320 and the second substrate 330 with the light emitting functioning material pattern 341 and the hole transporting functioning material pattern 342 are aligned and combined. These alignment and combination are performed under a vacuum or inert gas (Ar, $N_2$, etc.) atmosphere so as to protect the material patterns from moisture/oxygen. The combination may be performed by a mechanical pressing.

Figure 6E:
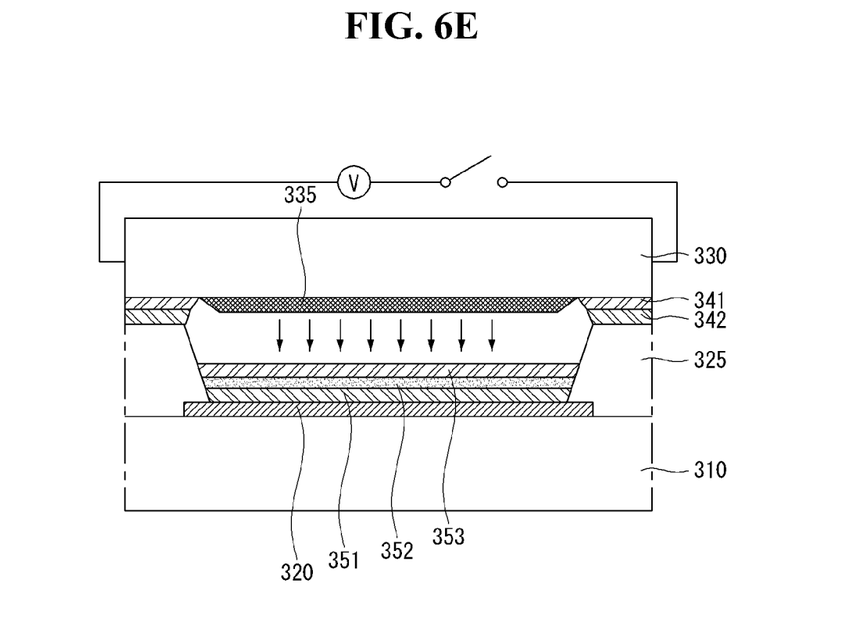

Next, referring to FIG. 6E, an external voltage (V) is applied to the heat-generating element 335 on the second substrate 330 where the alignment and the combination are completed. By the application of the voltage V, the heat-generating element 335 generates joule heat and in turn the materials in the overlying light emitting functioning material pattern 341 and the hole transporting functioning material pattern 342 sublimate. As a result, the light emitting functioning material pattern 341 and the hole transporting functioning material pattern 342 are transferred onto the pixel region of the first substrate 310 to form the hole transporting layer 351, the mixture layer 352, and the light emitting layer 353.

More in detail, the hole transporting functioning material pattern 342 firstly sublimates in an order near to the first substrate 310 to be transferred onto the first substrate 310. The hole transporting functioning material and the light emitting functioning material, which lie in a region where the hole transporting functioning material pattern 342 and the light emitting functioning material pattern 341 are adjacent to each other, simultaneously sublimate. At this time, the hole transporting functioning material pattern 342 is nearer to the first substrate, so the hole transporting functioning material is transferred more and the light emitting functioning material is gradually transferred. When most of the hole transporting functioning material pattern 342 is transferred, the light emitting functioning material pattern 341 actively sublimates to increase the transfer of the organic light emitting functioning material. Therefore, eventually, the hole transporting functioning material is transferred onto the first substrate 310 to form the hole transporting layer 351, the mixture layer 352 where the hole transporting functioning material and the light emitting functioning material have concentration gradients is formed on the hole transporting layer 351, and lastly the light emitting functioning material is transferred to form the light emitting layer 353.

At this time, since the first substrate 310 and the second substrate 330 have close contact to each other with the bank layer 325 between the first substrate 310 and the second substrate 330, it is possible not only to prevent a color mixing phenomenon generated by the transfer being deviated to other pixel regions or being spread, but also to accurately control a position where the materials are formed. Also, since one process due to the application of voltage enables the hole transporting layer 351 and the light emitting layer 353 to be formed at the same time, there is an advantage in that it is possible to save time which is wasted by a sequential scanning like a laser thermal transfer method, thereby a manufacturing process is simple and a manufacturing time is considerably shortened.

When these organic materials are exposed to high temperature for a long time, the materials typically are degenerated or their chemical bonds are destroyed. Therefore, in order to prevent the thermal degeneration of the organic materials, an application time of the voltage applied to the heat-generating element 335 may be in a range of about 0.1 μs to 1 s, and a power density of the voltage applied to the heat-generating element 335 may be in a range of about 0.1 W/cm$^2$ to 10000 W/cm$^2$. The voltage applied to the heat-generating element 335 may be of a direct current type or an alternating current type, and applied several times intermittently.

Figure 6F:
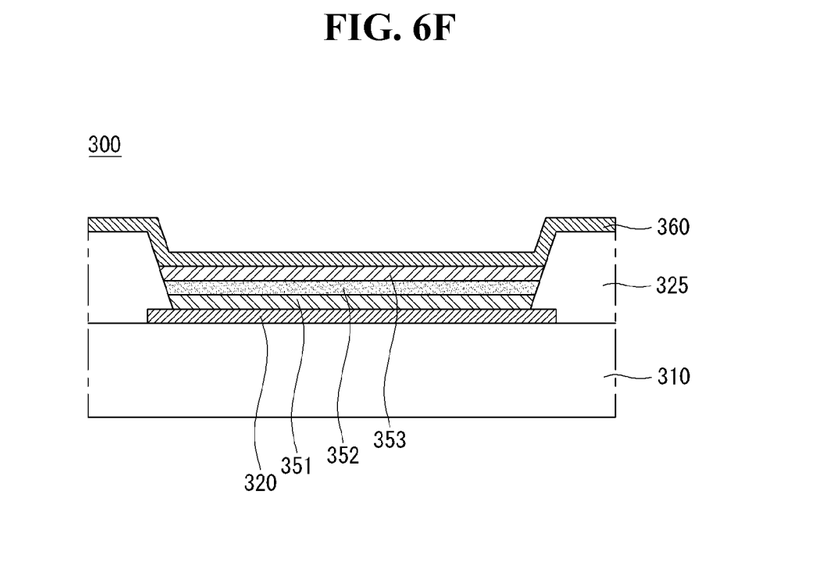

Subsequently, referring to FIG. 6F, the second electrode 360 are formed over the first substrate 310 which is also provided with the light emitting layer 353 to manufacture the OLED 300.

Figure 7:
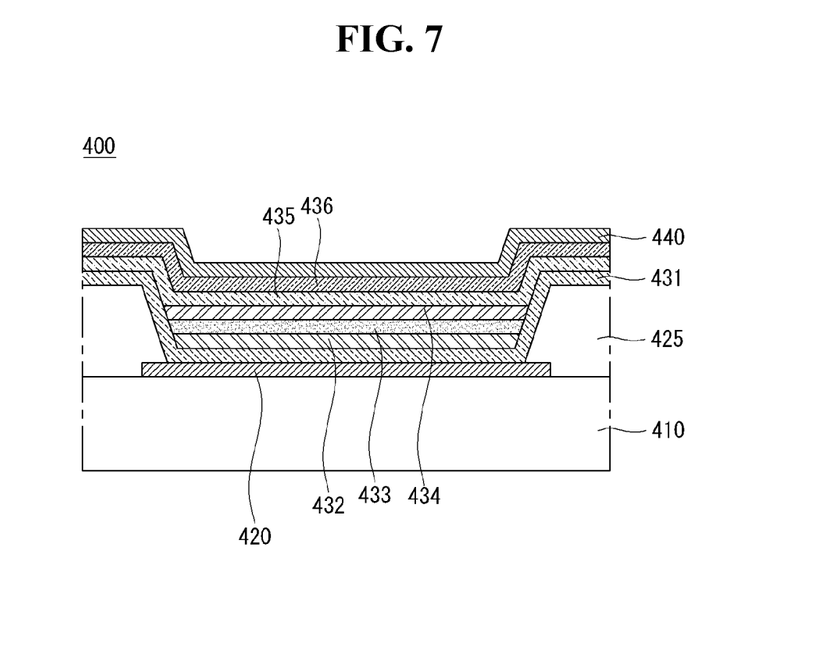
FIG. 7 is a diagram illustrating an OLED according to a fourth embodiment of this document.
Figure 8A:
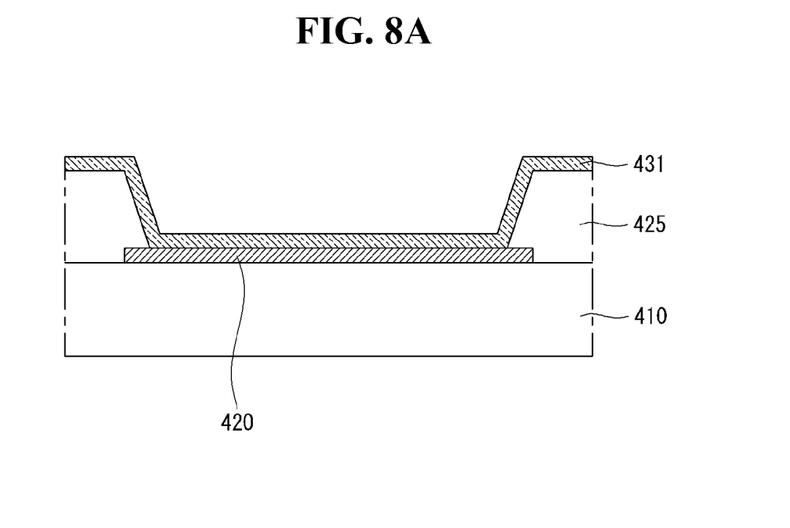
FIGS. 8A to 8C are diagrams illustrating the respective steps in a manufacturing method of the OLED according to the fourth embodiment of this document.
Figure 8B:
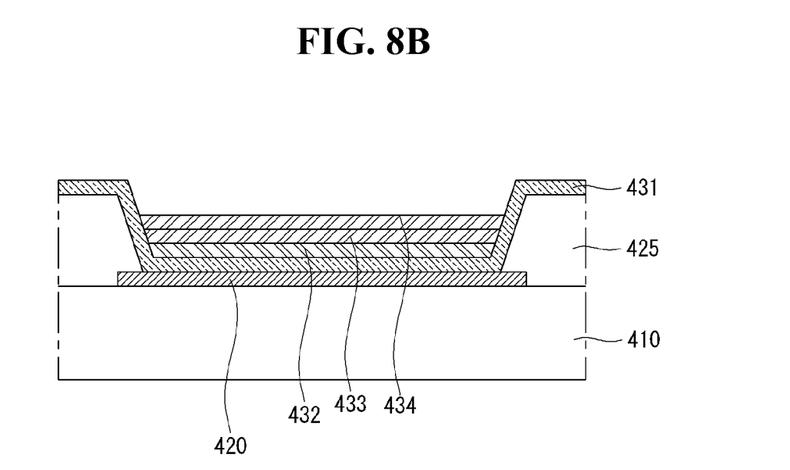
Figure 8C:
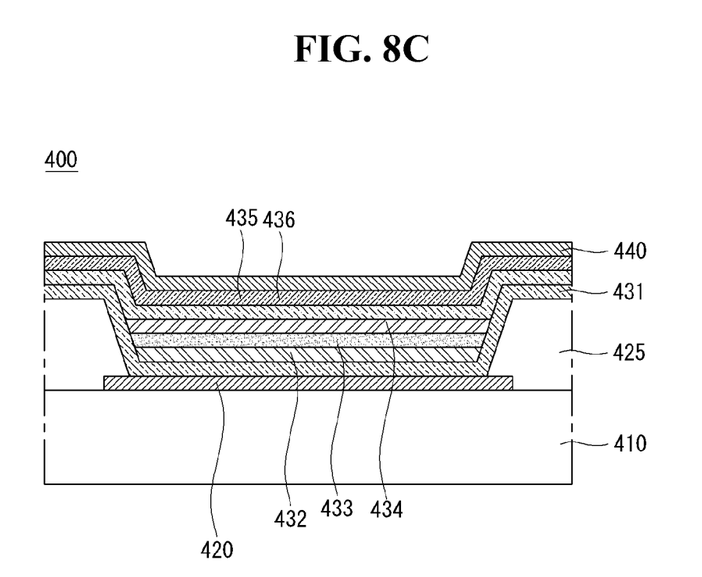

FIG. 7 is a diagram illustrating an OLED according to a fourth embodiment of this document, and FIGS. 8A to 8C are diagrams illustrating the respective steps in a manufacturing method of an OLED according to the fourth embodiment of this document.

Hereinafter, a manufacturing method of an OLED according to the fourth embodiment of this document will be described. The same steps as the above-described third embodiment will be described in outline.

Referring to FIG. 7, an OLED 400 according to the fourth embodiment of this document comprises a first substrate 410, a first electrode 420 formed on the first substrate 410, a bank layer 425 covering the edges of the first electrode 420 and exposing the first electrode 420, a hole injecting layer 431 formed on the first electrode 420, a hole transporting layer 432 formed on the hole injecting layer 431, a light emitting layer 434 formed over the hole transporting layer 432, an electron transporting layer 435 formed on the light emitting layer 434, and a second electrode 440 formed on the electron injecting layer 436, and further comprises a mixture layer 433, interposed between the hole transporting layer 432 and the light emitting layer 434, of a hole transporting functioning material and a light emitting functioning material which have concentration gradient respectively.

The OLED 400 further comprises the hole injecting layer 431 placed between the first electrode 420 and the hole transporting layer 432, and moreover further comprises the electron transporting layer 435 and the electron injecting layer 436 placed between the light emitting layer 434 and the second electrode 440.

A manufacturing method of the OLED 400 with the configuration described above will be described.

Referring to FIG. 8A, the first electrode 420 is formed on the first substrate 410. The first electrode 420 may be an anode electrode. The bank layer 425 is formed on the first electrode 420. The bank layer 425 covers the edges of the first electrode 420 and exposes the first electrode 420.

Next, the hole injecting layer 431 is formed over the first substrate 410 provided with the first electrode 420. The hole injecting layer 431 functions to make smooth the injection of holes from the first electrode 420 to the light emitting layer. The hole injecting layer 431 may be formed using the evaporation or the spin coating, and may have a thickness of about 1 to 150 nm.

Referring to FIG. 8B, the hole transporting layer 432, the mixture layer 433, and the light emitting layer 434 are formed over the first substrate 410. The fourth embodiment forms the hole transporting layer 432, the mixture layer 433, and the light emitting layer 434 through the same transfer step as the above-described third embodiment, and the description thereof is omitted.

Referring to FIG. 8C, the electron transporting layer 435 is formed over the first substrate 410 which is also provided with the light emitting layer 434. The electron transporting layer 435 functions to make smooth the transport of electrons, and formed using the evaporation or the spin coating. The electron transporting layer 435 may have a thickness of about 1 to 50 nm.

The electron transporting layer 435 may function to prevent the movement of holes from the first electrode to the second electrode via the light emitting layer. In other words, the electron transporting layer 435 functions as a hole blocking layer to enable holes and electrons to efficiently bond together in the light emitting layer.

The electron injecting layer 436 is formed over the first substrate 410 provided with the electron transporting layer 435. The electron injecting layer 436 functions to make smooth the injection of electrons, and formed using the evaporation or the spin coating. The electron injecting layer 436 may have a thickness of about 1 to 50 nm.

As described above, the OLEDs according to the third and fourth embodiments of this document are advantageous in that it is possible not only to prevent a color mixing phenomenon in the manufacturing process, but also to accurately control a position where the materials are formed, by forming the hole transporting layer, the mixture layer, and the light emitting layer, using the transfer process.

Also, since one process due to the application of voltage enables the hole transporting layer 351 and the light emitting layer 353 to be formed at the same time, there is an advantage in that it is possible to save time which is wasted by a sequential scanning like a laser thermal transfer method, thereby a manufacturing process is simple and a manufacturing time is considerably shortened.

Further, there is an advantage of improving lifespan of the OLED, by forming the mixture layer where the hole transporting functioning material and the light emitting functioning material have concentration gradient respectively, between the hole transporting layer and the light emitting layer.

Hereinafter, the OLED comprising the mixture layer according to an Embodiment of this document will be described in detail. It is to be noted that the disclosed Embodiment is only illustrative and this document is not limited to the following Embodiment.

Embodiment

The OLED was fabricated as follows. A light emitting area with 3 mm by 3 mm in size was patterned and cleaned on a glass substrate. The anode was formed using ITO at a thickness of 500 Å, and the hole injecting layer was formed using CuPc at a thickness of 1000 Å. The green light emitting functioning material was stacked using a mixture of CBP (i.e., a host) and Ir(PPY)$_3$ (i.e., a dopant) at a thickness of 300 Å on the doner substrate, and the hole transporting functioning material was stacked using NPD at a thickness of 1000 Å. The glass substrate and the doner substrate are combined, where the transfer process is performed to form the hole transporting layer, the mixture layer having concentration gradients, and the light emitting layer. Thereafter, the electron transporting layer was formed using spiro-PBD at a thickness of 200 Å, the electron injecting layer was formed using LiF at a thickness of 10 Å, and the second electrode was formed using Al at a thickness of 1000 Å.

Comparative Example

An OLED was fabricated was under the same conditions as the above-described Embodiment except that the hole transporting layer and the light emitting layer was respectively deposited using the evaporation and the mixture layer was not formed.

Figure 9:
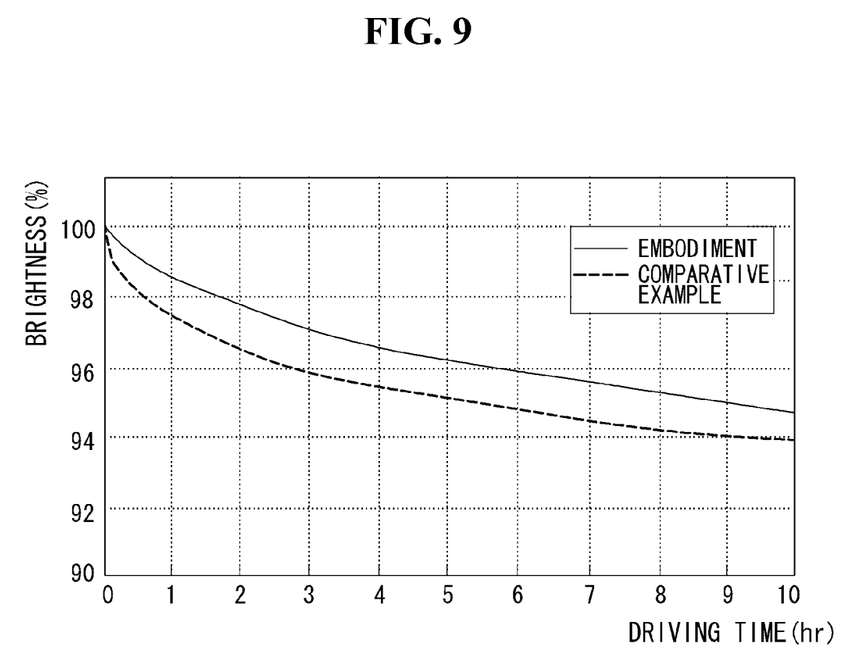
FIG. 9 is a graph illustrating lifespan of OLED manufactured in accordance with each of an Embodiment and a comparative example.

The driving voltage, luminous efficiency, power efficiency, quantum efficiency, and brightness of the OLED fabricated according to each of the Embodiment and the comparative example are listed in the following Table 1, and the lifespan characteristics thereof is shown in FIG. 9.

TABLE 1

| | driving voltage(V) | Luminous Efficiency (Cd/A) | Power Efficiency (lm/W) | Quantum Efficiency (%) | Brightness (Cd/m$^2$) |
|---|---|---|---|---|---|
| Comparative Example | 3.25 | 26.56 | 25.67 | 8.32 | 2656 |
| Embodiment | 3.27 | 25.99 | 24.95 | 8.16 | 2598 |

From Table 1, it can be seen that the OLED fabricated according to the Embodiment of this document shows nearly the same levels as the comparative example in the driving voltage and the efficiency.

However, referring to FIG. 9, it can be seen that the OLED according to the Embodiment has an excellent life characteristic compared with the comparative example.

As described above, the OLEDs according to the embodiments of this document have the mixture layers, placed between the hole transporting layer and the light emitting layer, where the hole transporting functioning material and the light emitting functioning material have concentration gradient respectively, and thus an energy barrier between the hole transporting layer and the light emitting layer is lowered to lengthen the lifespan of the OLED.

Therefore, there is an advantage in that it is possible to improve the lifespan of the OLED and in turn to provide the OLED with a high reliability.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A manufacturing method of an organic light emitting device comprising:
   forming a first electrode on a first substrate;
   forming a heat-generating element on a second substrate facing the first substrate;
   sequentially forming a light emitting functioning material pattern and a hole transporting functioning material pattern over the second substrate provided with the heat-generating element;
   aligning and combining the first substrate and the second substrate, and transferring the hole transporting functioning material pattern and the light emitting functioning material pattern, by applying a voltage to the heat-generating element on the second substrate, to thereby simultaneously form a hole transporting layer, a mixture layer where the mixture layer includes the hole transporting functioning material and the light emitting functioning material, wherein the hole transporting functioning material and the light emitting functioning material have a concentration gradient respectively; and
   forming a second electrode over the first substrate.

2. The manufacturing method of claim 1, wherein in the mixture layer, the hole transporting layer has a concentration gradient where a concentration of the hole transporting functioning material decreases toward the light emitting layer.

3. The manufacturing method of claim 2, wherein in the mixture layer, the light emitting layer has a concentration gradient where a concentration of the light emitting functioning material increases toward the light emitting layer.

4. The manufacturing method of claim 1, wherein in the mixture layer, the hole transporting functioning material and the light emitting functioning material have concentration gradients inversely proportional to each other.

5. The manufacturing method of claim 1, wherein the light emitting layer has a thickness of about 5 to 150 nm.

6. The manufacturing method of claim 5, wherein a thickness of the mixture layer is about 1 to 30% relative to that of the light emitting layer.

7. The manufacturing method of claim 1, further comprising:
   forming a hole injecting layer on the first electrode before forming the hole transporting layer, the mixture layer, and the light emitting layer.

8. The manufacturing method of claim 7, further comprising sequentially forming an electron transporting layer and an electron injecting layer on the light emitting layer after forming the hole transporting layer, the mixture layer, and the light emitting layer.

9. The manufacturing method of claim 1, further comprising forming an insulating layer on the second substrate before forming the hole transporting functioning material pattern and the light emitting functioning material pattern over the second substrate.

10. The manufacturing method of claim 1, wherein the heat-generating element is made of at least one selected from the group of consisting of Ag, Au, Al, Cu, Mo, Pt, Ti, W, and Ta.

* * * * *